(12) United States Patent
Hsueh et al.

(10) Patent No.: US 10,985,011 B2
(45) Date of Patent: Apr. 20, 2021

(54) STRUCTURE AND FORMATION METHOD OF SEMICONDUCTOR DEVICE WITH RESISTIVE ELEMENTS

(71) Applicant: Taiwan Semiconductor Manufacturing Co., Ltd., Hsinchu (TW)

(72) Inventors: Hsiu-Wen Hsueh, Taichung (TW); Yu-Hsiang Chen, Hsinchu (TW); Wen-Sheh Huang, Hsinchu (TW); Chii-Ping Chen, Hsinchu (TW); Wan-Te Chen, New Taipei (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 15/866,022

(22) Filed: Jan. 9, 2018

(65) Prior Publication Data
US 2019/0139754 A1    May 9, 2019

Related U.S. Application Data

(60) Provisional application No. 62/583,747, filed on Nov. 9, 2017.

(51) Int. Cl.
*H01L 21/02*  (2006.01)
*H01L 21/762* (2006.01)
(Continued)

(52) U.S. Cl.
CPC ......... *H01L 21/022* (2013.01); *H01L 21/304* (2013.01); *H01L 21/762* (2013.01);
(Continued)

(58) Field of Classification Search
CPC ... H01L 21/022; H01L 21/304; H01L 21/762; H01L 23/647; H01L 27/0635;
(Continued)

(56) References Cited

U.S. PATENT DOCUMENTS 6,258,713 B1   7/2001  Yu et al.
9,905,633 B1   2/2018  Yang
(Continued)

FOREIGN PATENT DOCUMENTS

TW    I527169 B    3/2016

OTHER PUBLICATIONS

U.S. Office Action, dated Jan. 7, 2019, for U.S. Appl. No. 15/599,687.
(Continued)

*Primary Examiner* — Patricia D Reddington
(74) *Attorney, Agent, or Firm* — Birch, Stewart, Kolasch & Birch, LLP

(57) ABSTRACT

A semiconductor device structure is provided. The semiconductor device structure includes a semiconductor substrate and a first resistive element and a second resistive element over the semiconductor substrate. The semiconductor device structure also includes a first conductive feature electrically connected to the first resistive element and a second conductive feature electrically connected to the second resistive element. The semiconductor device structure further includes a dielectric layer surrounding the first conductive feature and the second conductive feature.

20 Claims, 14 Drawing Sheets

(51) Int. Cl.
  *H01L 27/06* (2006.01)
  *H01L 23/64* (2006.01)
  *H01L 21/304* (2006.01)
  *H01L 27/08* (2006.01)
  *H01L 23/522* (2006.01)
  *H01L 49/02* (2006.01)
  *H01L 23/528* (2006.01)

(52) U.S. Cl.
  CPC ........ *H01L 23/5228* (2013.01); *H01L 23/647* (2013.01); *H01L 27/0635* (2013.01); *H01L 27/0802* (2013.01); *H01L 28/24* (2013.01); *H01L 23/528* (2013.01); *H01L 23/5226* (2013.01)

(58) Field of Classification Search
  CPC . H01L 27/0802; H01L 23/5228; H01L 28/24; H01L 23/5226; H01L 23/528
  USPC ......................................................... 257/154
  See application file for complete search history.

(56) References Cited

U.S. PATENT DOCUMENTS

| | | | |
|---|---|---|---|
| 2004/0227242 A1* | 11/2004 | Noguchi | H01L 21/76801 257/751 |
| 2006/0202291 A1 | 9/2006 | Kolb et al. | |
| 2007/0284662 A1 | 12/2007 | Chinthakindi et al. | |
| 2008/0237800 A1 | 10/2008 | Chinthakindi et al. | |
| 2012/0074573 A1* | 3/2012 | Dallmann | H01L 21/76843 257/751 |
| 2012/0112873 A1* | 5/2012 | Le Neel | H01C 17/0656 338/25 |
| 2012/0146186 A1 | 6/2012 | Lukaitis et al. | |
| 2013/0168815 A1 | 7/2013 | Le Neel et al. | |
| 2014/0125421 A1* | 5/2014 | Miyazaki | H01L 27/11573 331/111 |
| 2014/0264748 A1* | 9/2014 | Fujiwara | H01L 28/40 257/532 |
| 2015/0221713 A1* | 8/2015 | Li | H01L 23/5223 257/532 |
| 2016/0204100 A1 | 7/2016 | Zhang et al. | |
| 2017/0179033 A1* | 6/2017 | West | H01L 23/53223 |
| 2018/0058943 A1 | 3/2018 | Ge et al. | |

OTHER PUBLICATIONS

U.S. Office Action, dated Jun. 17, 2020, for U.S. Appl. No. 16/422,101.
U.S. Office Action, dated Sep. 24, 2020, for U.S. Appl. No. 16/422,101.
U.S. Office Action for U.S. Application No. 16/422,101, dated Dec. 30, 2020.

* cited by examiner

STRUCTURE AND FORMATION METHOD OF SEMICONDUCTOR DEVICE WITH RESISTIVE ELEMENTS

PRIORITY CLAIM AND CROSS-REFERENCE

This Application claims the benefit of U.S. Provisional Application No. 62/583,747, filed on Nov. 9, 2017, the entirety of which is incorporated by reference herein.

BACKGROUND

The semiconductor integrated circuit (IC) industry has experienced rapid growth. Technological advances in IC materials and design have produced generations of ICs. Each generation has smaller and more complex circuits than the previous generation.

In the course of IC evolution, functional density (i.e., the number of interconnected devices per chip area) has generally increased while geometric size (i.e., the smallest component (or line) that can be created using a fabrication process) has decreased. This scaling-down process generally provides benefits by increasing production efficiency and lowering associated costs.

However, these advances have increased the complexity of processing and manufacturing ICs. Since feature sizes continue to decrease, fabrication processes continue to become more difficult to perform. Therefore, it is a challenge to form reliable semiconductor devices at smaller and smaller sizes.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1A:
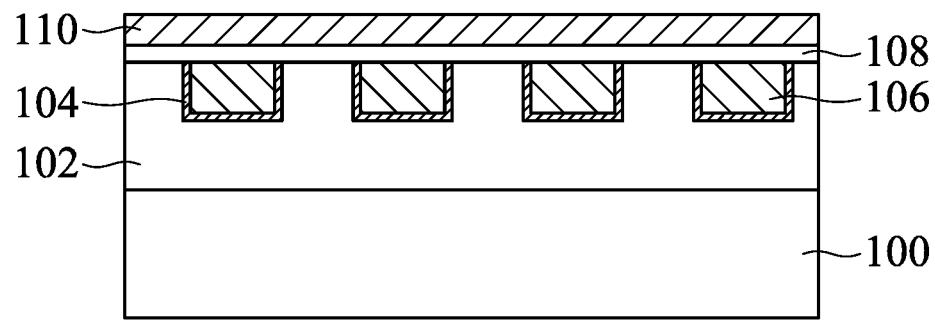
FIGS. 1A-1I are cross-sectional views of various stages of a process for forming a semiconductor device structure, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Some embodiments of the disclosure are described. Additional operations can be provided before, during, and/or after the stages described in these embodiments. Some of the stages that are described can be replaced or eliminated for different embodiments. Additional features can be added to the semiconductor device structure. Some of the features described below can be replaced or eliminated for different embodiments. Although some embodiments are discussed with operations performed in a particular order, these operations may be performed in another logical order.

FIGS. 1A-1I are cross-sectional views of various stages of a process for forming a semiconductor device structure, in accordance with some embodiments. As shown in FIG. 1A, a semiconductor substrate 100 is received or provided. In some embodiments, the semiconductor substrate 100 is a bulk semiconductor substrate, such as a semiconductor wafer. For example, the semiconductor substrate 100 includes silicon or other elementary semiconductor materials such as germanium. In some other embodiments, the semiconductor substrate 100 includes a compound semiconductor. The compound semiconductor may include silicon carbide, gallium arsenide, indium arsenide, indium phosphide, another suitable compound semiconductor, or a combination thereof. In some embodiments, the semiconductor substrate 100 includes a semiconductor-on-insulator (SOI) substrate. The SOI substrate may be fabricated using a separation by implantation of oxygen (SIMOX) process, a wafer bonding process, another applicable method, or a combination thereof.

In some embodiments, isolation features (not shown) are formed in the semiconductor substrate 100 to define and isolate various device elements (not shown) formed in the semiconductor substrate 100. The isolation features include, for example, trench isolation (STI) features or local oxidation of silicon (LOCOS) features.

In some embodiments, various device elements are formed in and/or on the semiconductor substrate 100. Examples of the various device elements that may be formed in the semiconductor substrate 100 include transistors (e.g., metal oxide semiconductor field effect transistors (MOSFET), complementary metal oxide semiconductor (CMOS) transistors, bipolar junction transistors (BJT), high-voltage transistors, high-frequency transistors, p-channel and/or n-channel field effect transistors (PFETs/NFETs), etc.), diodes, another suitable element, or a combination thereof. Various processes are performed to form the various device elements, such as deposition, etching, implantation, photolithography, annealing, planarization, one or more other applicable processes, or a combination thereof.

In some embodiments, a dielectric layer 102 is formed over the semiconductor substrate 100, as shown in FIG. 1A. The dielectric layer 102 may include multiple sub-layers. The dielectric layer 102 may be made of or include carbon-containing silicon oxide, silicon oxide, borosilicate glass (BSG), phosphoric silicate glass (PSG), borophosphosilicate glass (BPSG), fluorinated silicate glass (FSG), porous dielectric material, another suitable low-k dielectric material, one or more other suitable materials, or a combination thereof. In some embodiments, multiple conductive features are formed in the dielectric layer 102. The conductive features may include conductive contacts, conductive lines, and/or conductive vias. The dielectric layer 102 and the conductive features formed therein are a portion of an interconnection structure that will be subsequently formed. The formation of the dielectric layer 102 and the conductive features in the dielectric layer 102 may involve multiple deposition processes, patterning processes, and planarization processes.

The device elements in and/or on the semiconductor substrate 100 will be interconnected through the interconnection structure to be formed over the semiconductor substrate 100. As a result, integrated circuit devices are formed. The integrated circuit devices may include logic devices, memory devices (e.g., static random access memories, SRAMs), radio frequency (RF) devices, input/output (I/O) devices, system-on-chip (SoC) devices, image sensor devices, one or more other applicable types of devices, or a combination thereof.

In some embodiments, conductive features 106 are formed in the dielectric layer 102, as shown in FIG. 1A. The conductive features 106 may be conductive lines. In some embodiments, a barrier layer 104 is formed between the conductive features 106 and the dielectric layer 102. The barrier layer 104 may be used to prevent metal ions of the conductive features 104 from diffusing into the dielectric layer 102.

In some embodiments, trenches are formed in the dielectric layer 102. Each of the trenches may connect a via hole (not shown). The trenches are used to contain conductive lines and the barrier layer. The formation of the trenches may involve photolithography processes and etching processes. Afterwards, the barrier layer 104 is deposited over the dielectric layer 108. The barrier layer 104 extends on sidewalls and bottom portions of the trenches. The barrier layer 104 may be made of or include tantalum nitride, titanium nitride, one or more other suitable materials, or a combination thereof. The barrier layer 104 may be deposited using a chemical vapor deposition (CVD) process, an atomic layer deposition (ALD) process, a physical vapor deposition (PVD) process, an electroplating process, an electroless plating process, one or more other applicable processes, or a combination thereof. The barrier layer 104 may have a substantially uniform thickness.

Afterwards, a conductive material layer is deposited over the barrier layer 104 to fill the trenches, in accordance with some embodiments. The conductive material layer may be made of or include copper, cobalt, tungsten, titanium, nickel, gold, platinum, graphene, one or more other suitable materials, or a combination thereof. The conductive material layer may be deposited using a CVD process, an ALD process, a PVD process, an electroplating process, an electroless plating process, one or more other applicable processes, or a combination thereof.

Afterwards, the barrier layer 104 and the conductive material layer outside of the trenches are removed, in accordance with some embodiments. Remaining portions of the conductive material layer in trenches form the conductive features 106. In some embodiments, the barrier layer 104 and the conductive material layer outside of the trenches are removed using a planarization process. The planarization process may include a CMP process, a dry polishing process, a mechanical grinding process, an etching process, one or more other applicable processes, or a combination thereof. After the planarization process, top surfaces of the conductive features 106, the barrier layer 104, and the dielectric layer 102 may be substantially coplanar. The conductive features 106 may be one of the third to the seventh level metal lines.

As shown in FIG. 1A, a dielectric layer 108 is deposited over the dielectric layer 102 and the conductive features 106, in accordance with some embodiments. In some embodiments, the dielectric layer 108 functions as an etch stop layer. In some embodiments, the dielectric layer 108 is made of a different material than that of the dielectric layer 102. The dielectric layer 108 may be made of or include silicon carbide (SiC), nitrogen-doped silicon carbide, oxygen-doped silicon carbide, silicon nitride (SiN), silicon oxynitride (SiON), silicon oxide, one or more other suitable materials, or a combination thereof. The dielectric layer 108 may be deposited using a CVD process, an ALD process, a PVD process, one or more other applicable processes, or a combination thereof.

Afterwards, a resistive layer 110 is deposited over the dielectric layer 108, as shown in FIG. 1A in accordance with some embodiments. In some embodiments, the resistive layer 110 is made of or includes tantalum nitride, titanium nitride, amorphous silicon, one or more other suitable materials, or a combination thereof. In some embodiments, the resistive layer 110 is made of a nitrogen-containing material, such as tantalum nitride, titanium nitride, one or more other suitable materials, or a combination thereof. In some embodiments, the resistive layer 110 is deposited using a CVD process, an ALD process, a PVD process, one or more other applicable processes, or a combination thereof.

In some embodiments, the resistive layer 110 has a greater atomic concentration of nitrogen than that of the barrier layer 104. In some embodiments, the barrier layer 104 is also made of tantalum nitride, titanium nitride, one or more other suitable materials, or a combination thereof. In some embodiments, both the barrier layer 104 and the resistive layer 110 are made of tantalum nitride or titanium nitride. However, the atomic concentration of nitrogen of the resistive layer 110 is greater than that of the barrier layer 104. In some embodiments, the atomic concentration of nitrogen of the barrier layer 104 is in a range from about 30% to about 60%. In some embodiments, the atomic concentration of nitrogen of the resistive layer 110 is in a range from about 40% to about 70%. Due to the higher atomic concentration of nitrogen, the resistive layer 110 may have a greater resistance than that of the barrier layer 104.

In some embodiments, the resistive layer 110 is denser than the barrier layer 104. In some embodiments, the resistive layer 110 has a density that is in a range from about 12 $g/cm^3$ to about 16 $g/cm^3$. In some embodiments, the barrier layer 104 has a density that is in a range from about 10 $g/cm^3$ to about 14 $g/cm^3$.

In some embodiments, the resistive layer 110 is thinner than the conductive features 106. The ratio of the thickness of the resistive layer 110 to the thickness of the conductive feature 106 may be in a range from about 1/20 to about 1/15.

In some cases, if the ratio is greater than about 1/15, the resistive layer 110 might have a resistance that is not high enough for some applications. In some other cases, if the ratio is smaller than about 1/20, the quality or reliability of the resistive layer 110 might need to be improved for some applications.

Figure 1B:
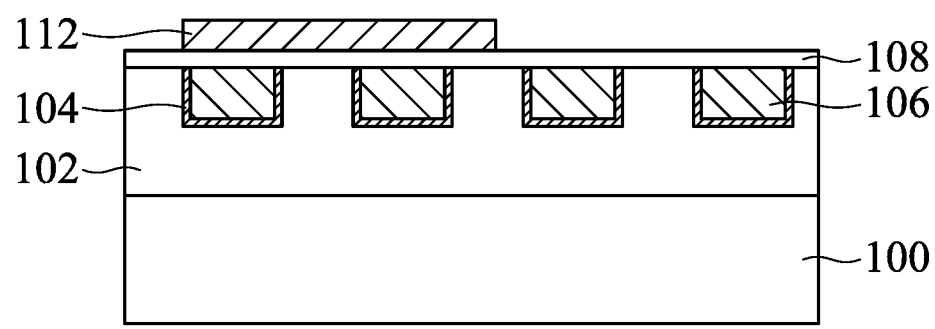

As shown in FIG. 1B, the resistive layer 110 is afterwards patterned to form a resistive element 112, in accordance with some embodiments. The formation of the resistive element 112 may involve one or more photolithography processes and etching processes. In some embodiments, a patterned photoresist layer may be used to assist in the patterning of the resistive layer 110. The top view of the resistive element 112 may have any suitable shape. For example, the top view of the resistive element 112 has a rectangular shape or a square shape. The dielectric layer 108 may function as an etch stop layer to protect the dielectric layer 102 and the conductive features 106 during the patterning of the resistive layer 110.

Figure 1C:
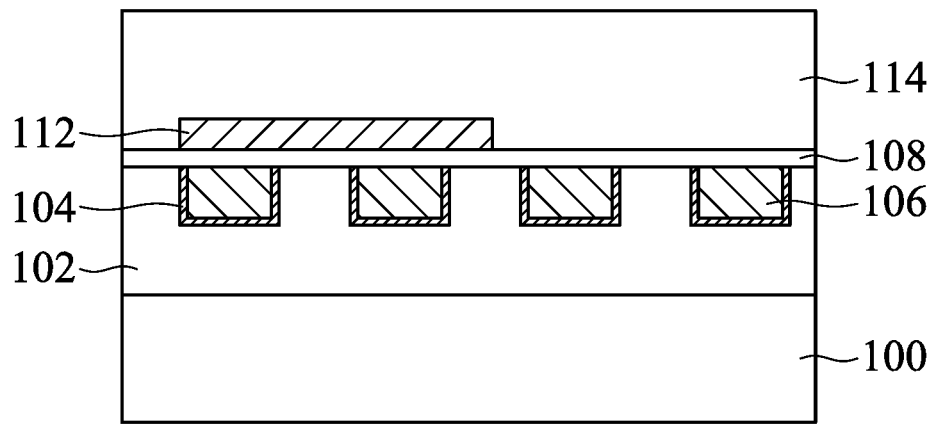

As shown in FIG. 1C, a dielectric layer 114 is deposited over the resistive element 112 and the dielectric layer 108, in accordance with some embodiments. The dielectric layer 114 may be made of or include carbon-containing silicon oxide, silicon oxide, borosilicate glass (BSG), phosphoric silicate glass (PSG), borophosphosilicate glass (BPSG), fluorinated silicate glass (FSG), porous dielectric material, another suitable low-k dielectric material, one or more other suitable materials, or a combination thereof. The dielectric layer 114 may be deposited using a CVD process, an ALD process, a PVD process, a spin-on process, a spray coating process, one or more other applicable processes, or a combination thereof.

Figure 1D:
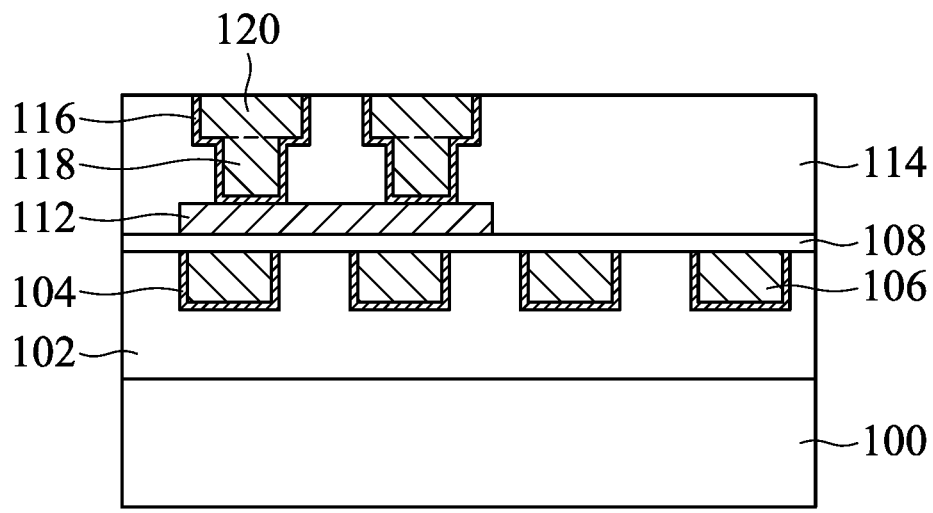

As shown in FIG. 1D, conductive vias 118 and conductive lines 120 are formed in the dielectric layer 114, in accordance with some embodiments. Trenches and via holes are formed in the dielectric layer 114 using one or more photolithography processes and etching processes. The trenches are used to contain the conductive lines 120 and the via holes are used to contain the conductive vias 118. In some embodiments, the conductive vias 110 slightly extend into the resistive element 112. In some other embodiments, the conductive vias 110 do not extend into the resistive element 112.

In some embodiments, a barrier layer 116 is formed over sidewalls and bottoms of the trenches and via holes. In some embodiments, the barrier layer 116 is in direct contact with the resistive element 112. The material and formation method of the barrier layer 116 may be the same as or similar to those of the barrier layer 104. The material and formation method of the conductive vias 118 and the conductive lines 120 may be the same as or similar to those of the conductive features 106.

Figure 1E:
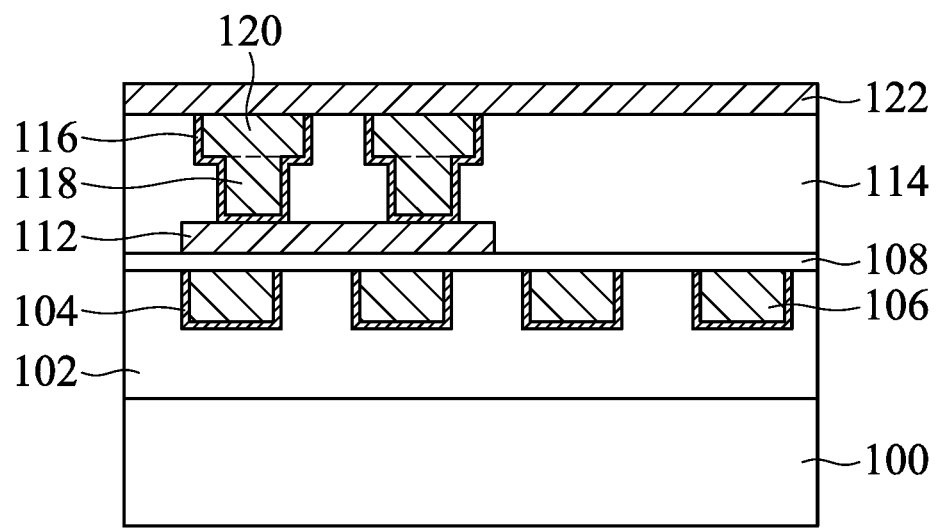

As shown in FIG. 1E, a resistive layer 122 is deposited over the conductive lines 120 and the dielectric layer 114, in accordance with some embodiments. The material and formation method of the resistive layer 122 may be the same as or similar to those of the resistive layer 110. In some embodiments, the resistive layer 122 and the resistive layer 110 have different compositions. In some embodiments, the resistive layer 122 has a greater atomic concentration of nitrogen than that of the resistive layer 110. The resistive layer 122 may have greater resistance than that of the resistive layer 110. In some embodiments, the resistive layer 122 and the resistive layer 110 have different thicknesses. For example, the resistive layer 122 is thinner than the resistive layer 110.

Figure 1F:
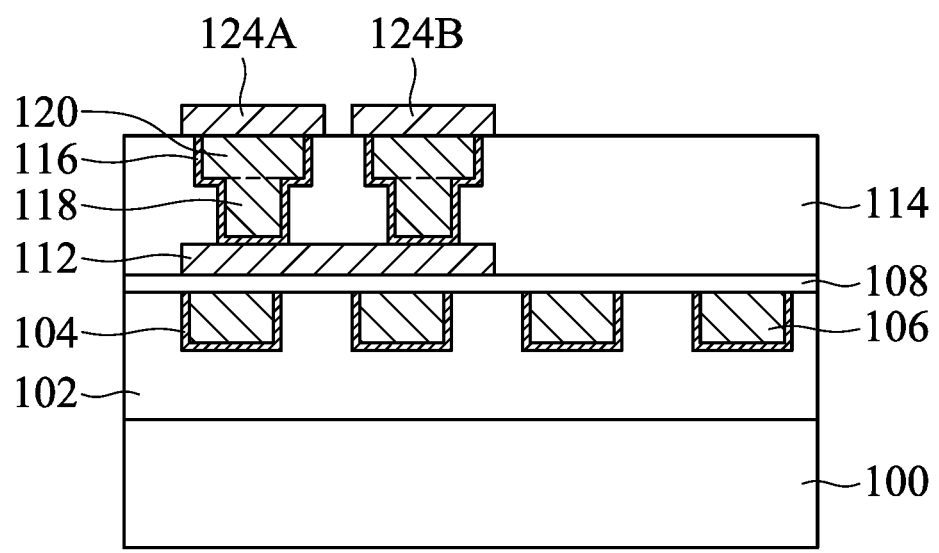

As shown in FIG. 1F, the resistive layer 122 is patterned to form resistive elements 124A and 124B, in accordance with some embodiments. The formation method of the resistive element 124A or 124B may be the same as or similar to those of the resistive element 112. In some embodiments, the resistive elements 124A and 124B are in direct contact with the barrier layer 116 and the conductive features such as the conductive lines 120. In some embodiments, the resistive elements 124A and 124B are in direct contact with the dielectric layer 114.

Figure 2:
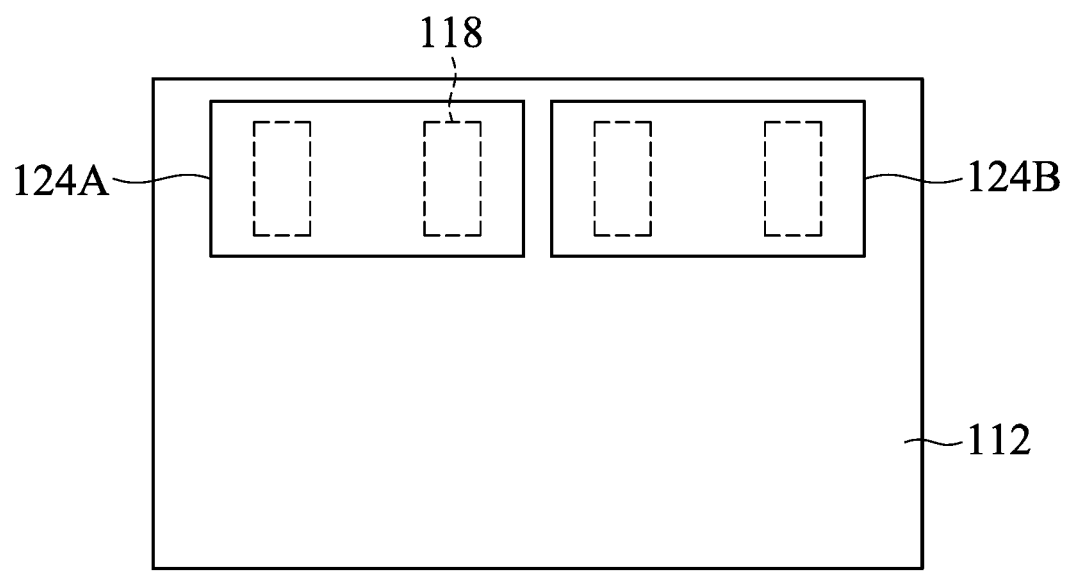
FIG. 2 is a top view of a semiconductor device structure, in accordance with some embodiments.

The top view of the resistive element 124A or 124B may have any suitable shape. For example, the top view of the resistive element 124A or 124B has a rectangular shape or a square shape. FIG. 2 is a top view of a semiconductor device structure, in accordance with some embodiments. FIG. 2 shows the relationship between the resistive elements 124A and 124B, the resistive element 112, and the conductive vias 118. For clarity, some elements are not shown in FIG. 2. In some embodiments, the resistive element 112 occupies larger area than the resistive elements 124A and 124B. Conductive features (such as the conductive vias 118) are used to form electrical connection between the resistive element 112 and the resistive element 124A or 124B. As shown in FIGS. 1F and 2, the resistive element 112 electrically connects another resistive element (such as the resistive element 124A or 124B) stacked thereon in series through the conductive features including the conductive vias 118.

Two or more resistive elements are stacked and electrically connected to each other in series. Higher resistance may therefore be obtained without occupying additional area. The flexibility of layout design is improved accordingly.

Figure 1G:
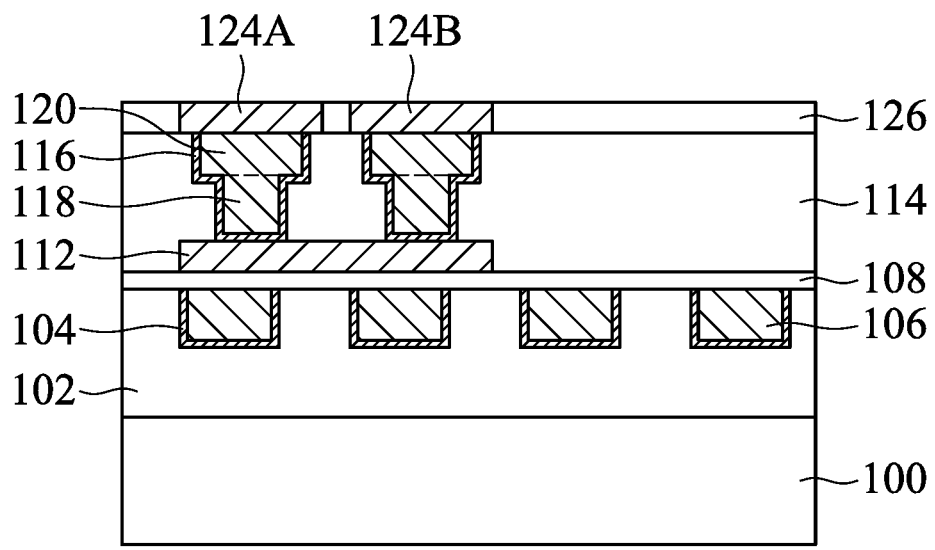

As shown in FIG. 1G, an etch stop layer 126 is formed over the dielectric layer 114 to surround the resistive elements 124A and 124B, in accordance with some embodiments. The material and formation method of the etch stop layer 126 may be the same as or similar to those of the dielectric layer 108. In some embodiments, an etch stop material layer is deposited over the dielectric layer 114 and the resistive elements 124A and 124B. Afterwards, the etch stop material layer is etched back or polished back to expose the resistive elements 124A and 124B. As a result, the etch stop layer 126 is formed. In some embodiments, the top surface of the etch stop layer 126 is substantially coplanar with the top surfaces of the resistive elements 124A and 124B.

Figure 1H:
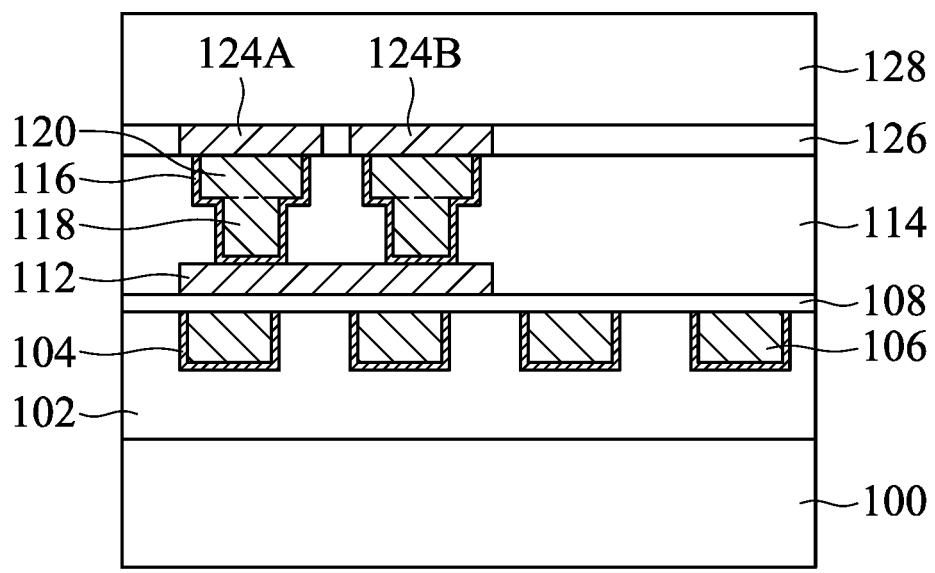

As shown in FIG. 1H, a dielectric layer 128 is deposited over the etch stop layer 126 and the resistive elements 124A and 124B, in accordance with some embodiments. The material and formation method of the dielectric layer 128 may be the same as or similar to those of the dielectric layer 114.

Figure 1I:
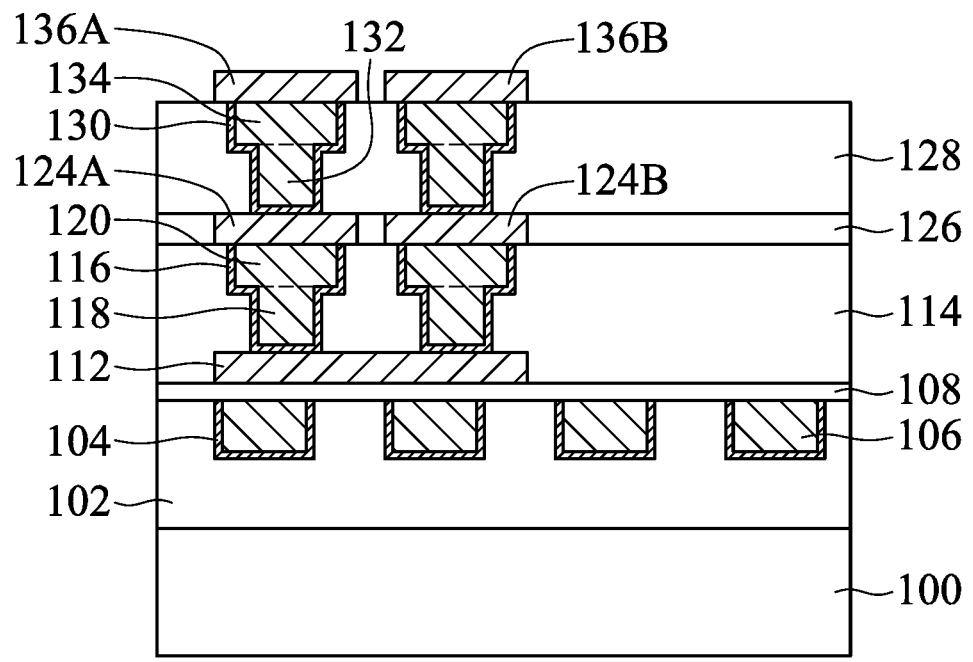

As shown in FIG. 1I, conductive vias 132 and conductive lines 134 are formed in the dielectric layer 128, in accordance with some embodiments. In some embodiments, a barrier layer 130 is formed between the dielectric layer 128 and the conductive features such as the conductive vias 132 and the conductive lines 134. In some embodiments, the barrier layer 130 is in direct contact with the resistive elements 124A and/or 124B. The material and formation method of the barrier layer 130 may be the same as or similar to those of the barrier layer 116. The material and formation method of the conductive vias 132 and the conductive lines 134 may be the same as or similar to those of the conductive vias 118 and the conductive lines 120.

Afterwards, resistive elements 136A and 136B are formed over the conductive lines 134 and the dielectric layer 128, as shown in FIG. 1I in accordance with some embodiments. The material and formation method of the resistive elements 136A and 136B may be the same as or similar to those of the resistive elements 124A and 124B. More than two resistive elements may stacked together to provide higher resistance without occupying larger area. The performance of the semiconductor device structure is improved.

In some embodiments, multiple resistive elements are vertically stacked to achieve desired resistance. However, many variations and/or modifications can be made to embodiments of the disclosure. In some other embodiments, multiple resistive elements are positioned horizontally. These resistive elements may operate independently. Alternatively, these resistive elements may be electrically connected to each other in series and operate simultaneously.

Figure 3A:
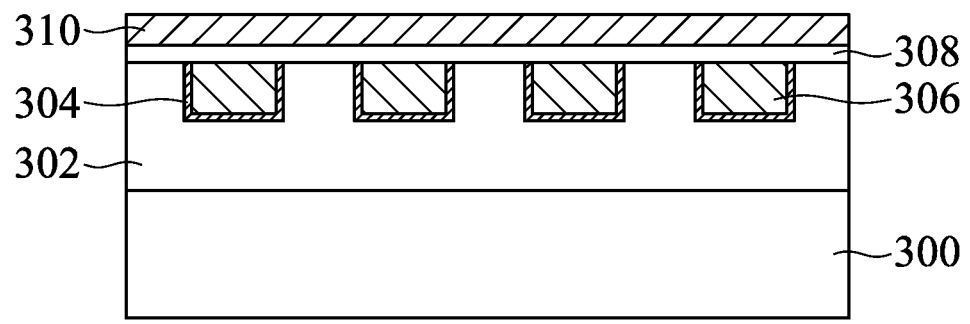
FIGS. 3A-3H are cross-sectional views of various stages of a process for forming a semiconductor device structure, in accordance with some embodiments.

FIGS. 3A-3H are cross-sectional views of various stages of a process for forming a semiconductor device structure with resistive elements, in accordance with some embodiments. As shown in FIG. 3A, a semiconductor substrate 300 is received or provided. The semiconductor substrate 300 may be the same as or similar to the semiconductor substrate 100. Afterwards, an interconnection structure including a dielectric layer 302 and conductive features 306 are formed over the semiconductor substrate 300, as shown in FIG. 3A. The dielectric layer 302 may be the same as or similar to the dielectric layer 102. The material and formation method of the conductive features 306 may be the same as or similar to those of the conductive features 106. In some embodiments, a barrier layer 304 is formed between the dielectric layer 302 and the conductive features 306. The material and formation method of the barrier layer 304 may be the same as or similar to those of the barrier layer 104.

Afterwards, a dielectric layer 308 is deposited over the dielectric layer 302 and the conductive features 306, as shown in FIG. 3A in accordance with some embodiments. The material and formation method of the dielectric layer 308 may be the same as or similar to those of the dielectric layer 108.

Afterwards, a resistive layer 310 is deposited over the dielectric layer 308, as shown in FIG. 3A in accordance with some embodiments. The material and formation method of the resistive layer 310 may be the same as or similar to those of the resistive layer 110.

Figure 3B:
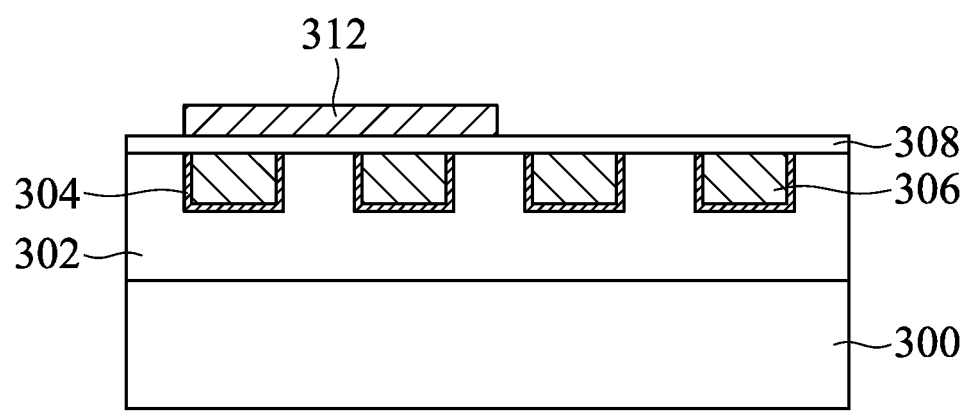

As shown in FIG. 3B, the resistive layer 310 is partially removed to form a resistive element 312, in accordance with some embodiments. The resistive element 312 may be formed using a photolithography process and an etching process. The top view of the resistive element 312 may have any suitable shape, such as rectangular shape or square shape.

Figure 3C:
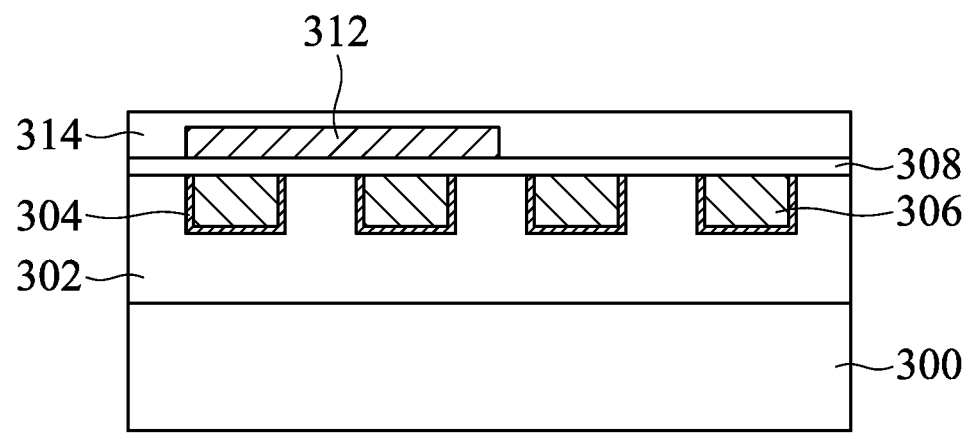

As shown in FIG. 3C, a dielectric layer 314 is deposited over the resistive element 312 and the dielectric layer 308, in accordance with some embodiments. The dielectric layer 314 covers the top surface of the resistive element 312. The material and formation method of the dielectric layer 314 may be the same as or similar to those of the dielectric layer 114. In some embodiments, a planarization process is used to provide the dielectric layer 314 with a substantially planar top surface, which may facilitate a subsequent patterning process.

Figure 3D:
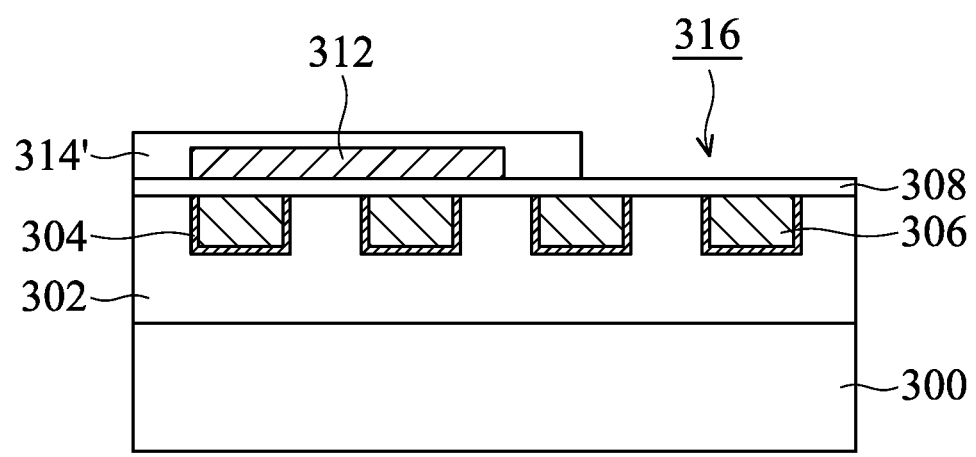

As shown in FIG. 3D, the dielectric layer 314 is partially removed to form a patterned dielectric layer 314', in accordance with some embodiments. A photolithography process and an etching process may be used to form the patterned dielectric layer 314'. An opening 316 is formed in the patterned dielectric layer 314'. The opening 316 is used to contain a second resistive element that will be formed later.

Figure 3E:
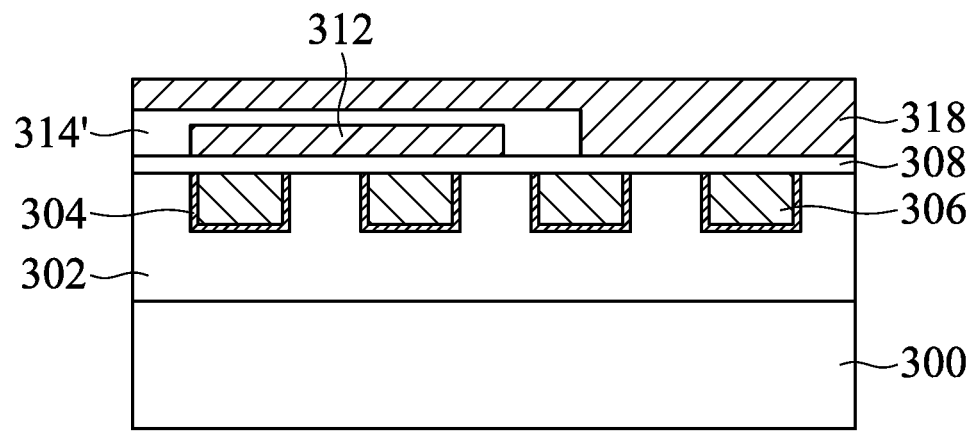

As shown in FIG. 3E, a resistive layer 318 is deposited over the patterned dielectric layer 314' and the dielectric layer 308, in accordance with some embodiments. In some embodiments, the resistive layer 318 extends into the opening 316. In some embodiments, the resistive layer 318 completely fills the opening 316. The material and formation method of the resistive layer 318 may be similar to those of the resistive layer 110. In some embodiments, the resistive layer 318 and the resistive layer 310 have different compositions. In some embodiments, the resistive layer 318 has a greater atomic concentration of nitrogen than that of the resistive layer 310. The resistive layer 312 may have greater resistance than that of the resistive layer 310. In some other embodiments, the resistive layer 310 has a greater atomic concentration of nitrogen than that of the resistive layer 318. The resistive layer 310 may have greater resistance than that of the resistive layer 318.

Figure 3F:
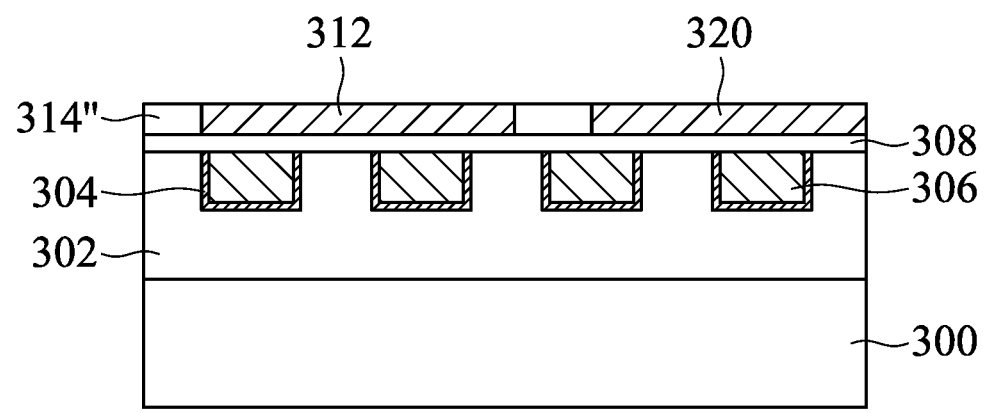

As shown in FIG. 3F, the resistive layer 318 is etched back or polished back to form a resistive element 320, in accordance with some embodiments. The patterned dielectric layer 314' may also be thinned during the formation of the resistive element 320. As a result, a thinned dielectric layer 314" is formed, and the resistive element 312 is exposed. In some embodiments, the resistive layer 318 is etched back using a dry etching process. In some embodiments, the resistive layer 318 is polished back using a chemical mechanical polishing (CMP) process, a dry polishing process, one or more other applicable processes, or a combination thereof. In some embodiments, the top surfaces of the resistive element 312, the resistive element 320, and the dielectric layer 314" are substantially coplanar. In some embodiments, the bottom surfaces of the resistive elements 312 and 320 are substantially coplanar with each other.

Figure 3G:
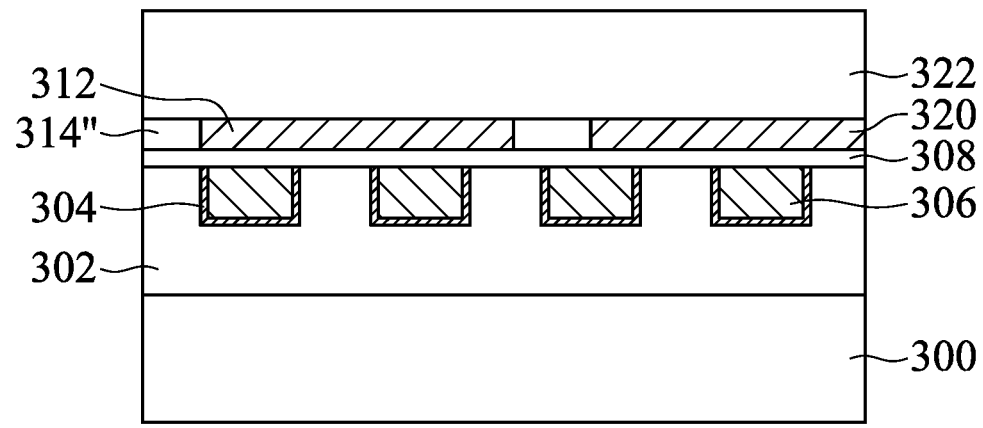

As shown in FIG. 3G, a dielectric layer 322 is deposited over the dielectric layer 314" and the resistive elements 312 and 320, in accordance with some embodiments. The material and formation method of the dielectric layer 322 may be the same as or similar to those of the dielectric layer 114.

Figure 3H:
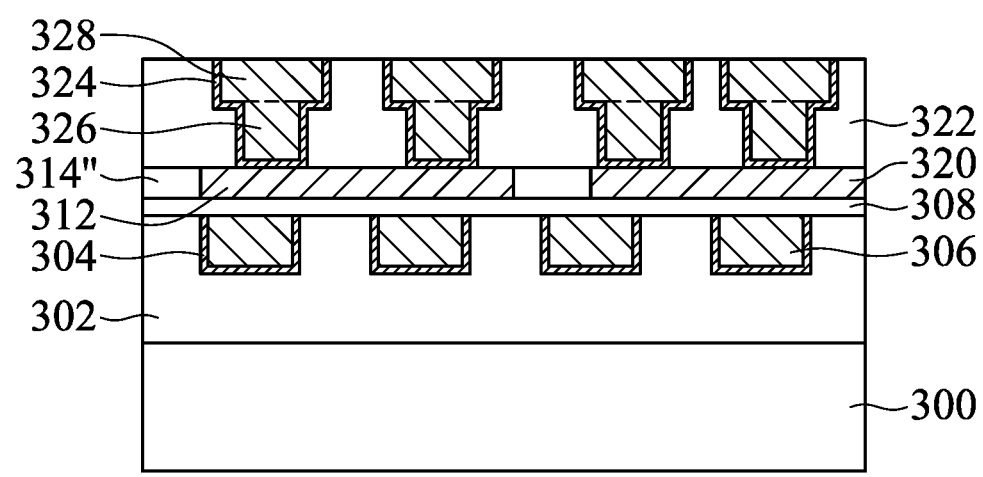

As shown in FIG. 3H, conductive vias 326 and conductive lines 328 are formed in the dielectric layer 322, in accordance with some embodiments. The material and formation method of the conductive vias 326 and the conductive lines 328 may be the same as or similar to those of the conductive vias 118 and the conductive lines 120. In some embodiments, a barrier layer 324 is formed before the formation of the conductive vias 326 and the conductive lines 328. The material and formation method of the barrier layer 324 may be the same as or similar to those of the barrier layer 104. In some embodiments, the barrier layer 324 is in direct contact with the resistive element 312 and/or the resistive element 320.

In some embodiments, the resistive element 312 has a different composition than the resistive element 320. In some embodiments, the resistive element 312 has different resistance than the resistive element 320. In some embodiments, the resistive element 312 and the resistive element 320 operate independently. The resistive element 312 is not electrically connected to the resistive element 320. In some other embodiments, the resistive element 312 is electrically connected to the resistive element 320 in series through some of the conductive vias 326 and some of the conductive lines 328.

Many variations and/or modifications can be made to embodiments of the disclosure. In some embodiments, the resistive elements have multiple functions. In some embodiments, stacked resistive elements are formed to function as a resistor and/or a capacitor.

Figure 4A:
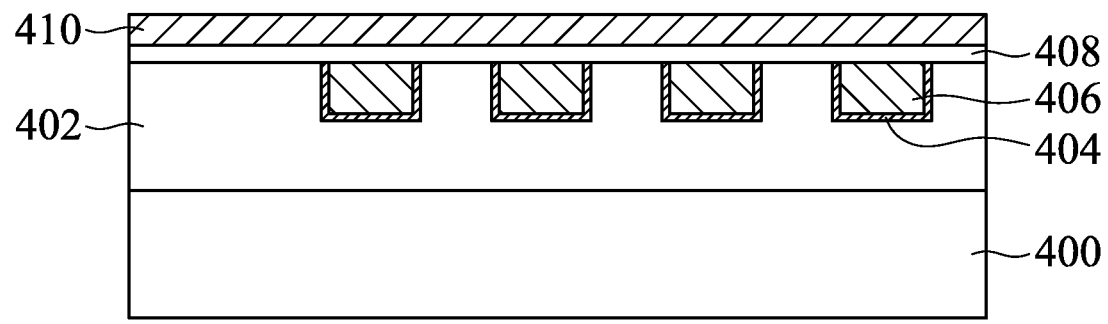
FIGS. 4A-4F are cross-sectional views of various stages of a process for forming a semiconductor device structure, in accordance with some embodiments.

FIGS. 4A-4F are cross-sectional views of various stages of a process for forming a semiconductor device structure with resistive elements, in accordance with some embodiments. As shown in FIG. 4A, a semiconductor substrate 400 is received or provided. The semiconductor substrate 400 may be the same as or similar to the semiconductor substrate 100. Afterwards, an interconnection structure including a dielectric layer 402 and conductive features 406 are formed over the semiconductor substrate 400, as shown in FIG. 4A. The dielectric layer 402 may be the same as or similar to the dielectric layer 102. The material and formation method of the conductive features 406 may be the same as or similar to those of the conductive features 106. In some embodiments, a barrier layer 404 is formed between the dielectric layer 402 and the conductive features 406. The material and formation method of the barrier layer 404 may be the same as or similar to those of the barrier layer 104.

Afterwards, a dielectric layer 408 is deposited over the dielectric layer 402 and the conductive features 406, as shown in FIG. 4A in accordance with some embodiments. The material and formation method of the dielectric layer 408 may be the same as or similar to those of the dielectric layer 108.

Afterwards, a resistive layer 410 is deposited over the dielectric layer 408, as shown in FIG. 4A in accordance with some embodiments. The material and formation method of the resistive layer 410 may be the same as or similar to those of the resistive layer 110.

Figure 4B:
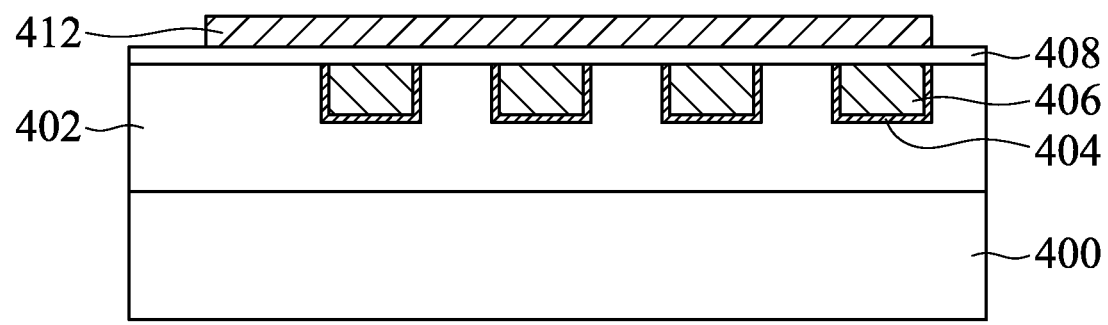

As shown in FIG. 4B, the resistive layer 410 is partially removed to form a resistive element 412, in accordance with some embodiments. The resistive element 412 may be formed using a photolithography process and an etching process. The top view of the resistive element 412 may have any suitable shape, such as rectangular shape or square shape.

Figure 4C:
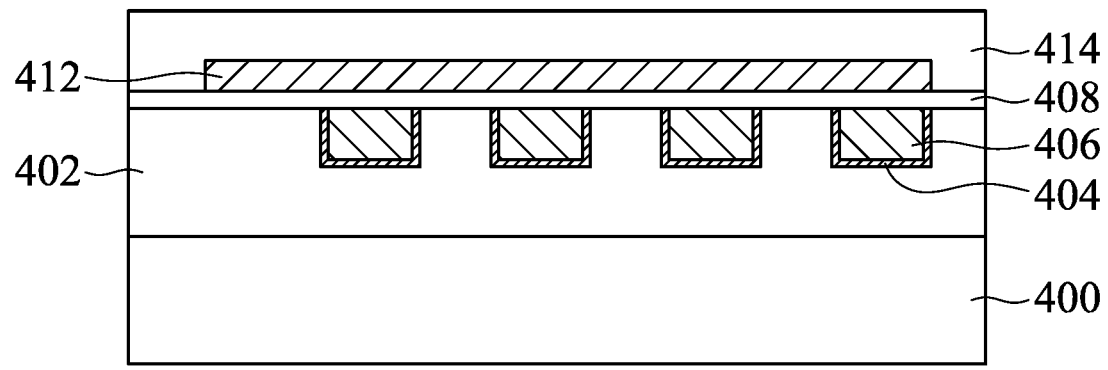

As shown in FIG. 4C, a dielectric layer 414 is deposited over the resistive element 412 and the dielectric layer 408, in accordance with some embodiments. The dielectric layer 414 covers the top surface of the resistive element 412. The material and formation method of the dielectric layer 414 may be the same as or similar to those of the dielectric layer 108. In some embodiments, a planarization process is used to provide the dielectric layer 414 with a substantially planar top surface, which may facilitate a subsequent patterning process. In some embodiments, the dielectric layer 414 functions as an etch stop layer during subsequent patterning process for forming conductive vias. In some embodiments, the dielectric layer 414 functions as a capacitor dielectric layer. In some embodiments, the dielectric layer 414 has a greater dielectric constant than that of the dielectric layer 408.

Figure 4D:
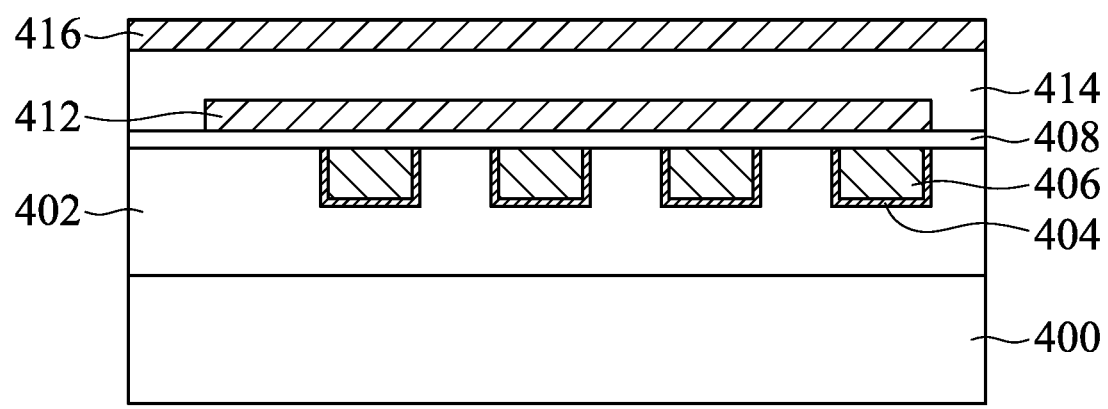

As shown in FIG. 4D, a resistive layer 416 is deposited over the dielectric layer 414, in accordance with some embodiments. The material and formation method of the resistive layer 416 may be the same as or similar to those of the resistive layer 122.

Figure 4E:
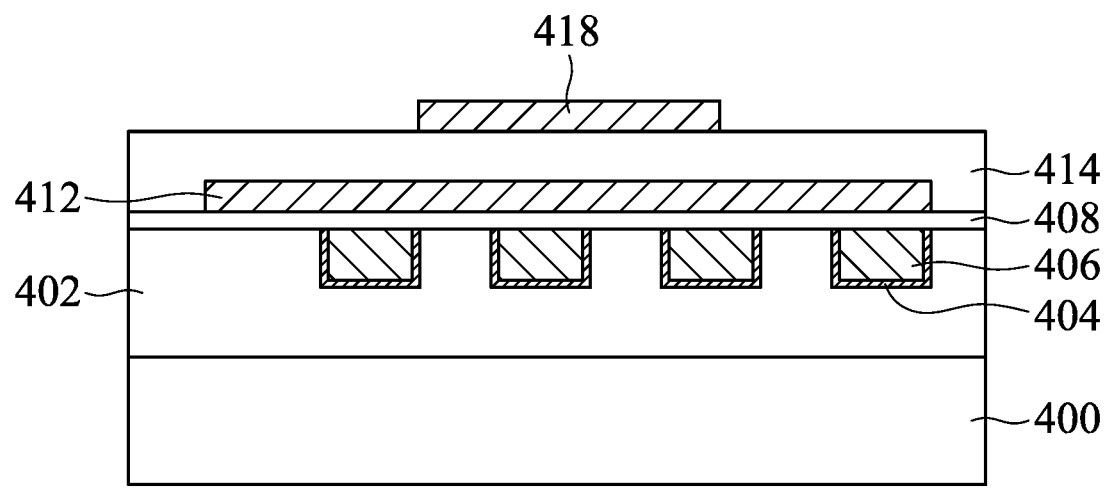

As shown in FIG. 4E, the resistive layer 416 is patterned to form a resistive element 418, in accordance with some embodiments. The top view of the resistive element 416 may have any suitable shape. The top view of the resistive element 416 may have a rectangular shape or a square shape.

Figure 4F:
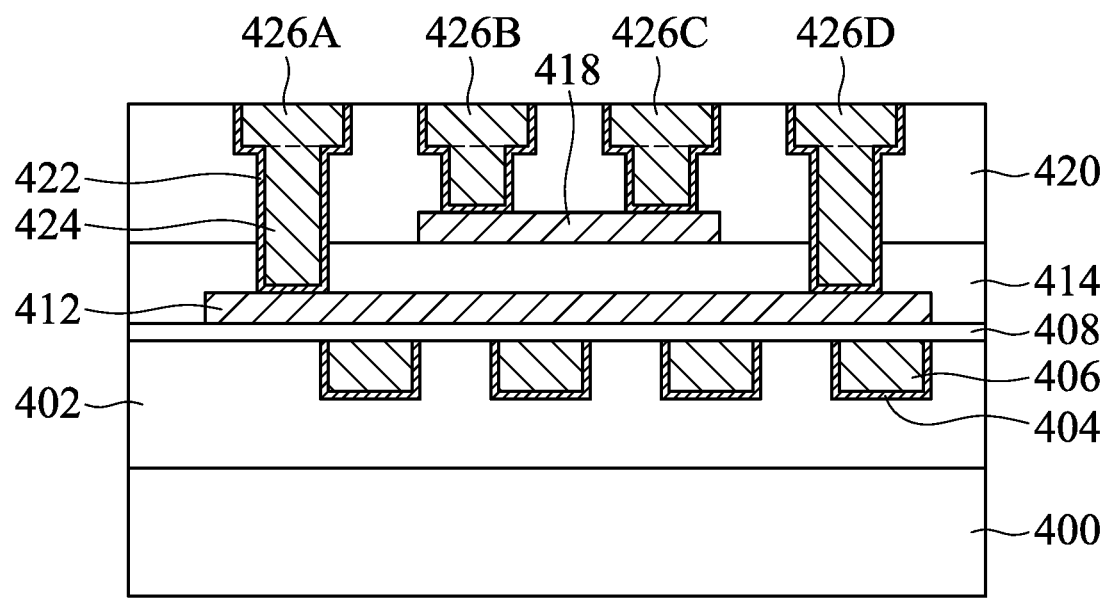

As shown in FIG. 4F, a dielectric layer 420 is deposited over the dielectric layer 414 and the resistive element 418, in accordance with some embodiments. The material and formation method of the dielectric layer 420 may be the same as or similar to those of the dielectric layer 114. In some embodiments, the dielectric layer 414 has a greater dielectric constant than that of the dielectric layer 420.

Afterwards, conductive features including conductive vias 424 and conductive lines 426A, 426B, 426C, and 426D are formed in the dielectric layer 420, as shown in FIG. 4F in accordance with some embodiments. The material and formation method of the conductive vias 424 and the conductive lines 426A-426D may be the same as or similar to those of the conductive vias 118 and the conductive lines 120. In some embodiments, during the formation of via holes used for containing the conductive vias 424, the dielectric layer 414 may function as an etch stop layer. In some embodiments, a barrier layer 422 is formed to prevent metal ions of the conductive features from diffusing into the dielectric layer 420. The material and formation method of the barrier layer 422 may be the same as or similar to those of the barrier layer 104.

In some embodiments, the conductive vias 424 slightly extend into the resistive elements 412 and 418. In some embodiments, the conductive vias 424 directly under the conductive lines 426B and 426C extend deeper into the resistive element 418 than the other conductive vias 424 extending into the resistive element 412. In some other embodiments, the conductive vias 424 do not extend into the resistive element 412 or the resistive element 418.

In some embodiments, the resistive elements 412 and 418 operate independently. Each of the resistive elements 412 and 418 functions as a resistor. In some embodiments, the conductive line 426A is positively biased, and the conductive line 426D is negatively biased. Similarly, the conductive line 426B is positively biased, and the conductive line 426C is negatively biased.

In some other embodiments, the resistive elements 412 and 418 may be switched to another operation mode. The resistive elements 412 and 418 may operate together and function as a capacitor. The dielectric layer 414 between the resistive elements 412 and 418 may be used as a capacitor dielectric layer. In some embodiments, the conductive lines 426B and 426C are positively biased, and the conductive lines 426A and 426D are negatively biased. In these cases, the resistive element 418 also functions as an upper electrode of the capacitor. The resistive element 412 also functions as a lower electrode of the capacitor.

Figure 5:
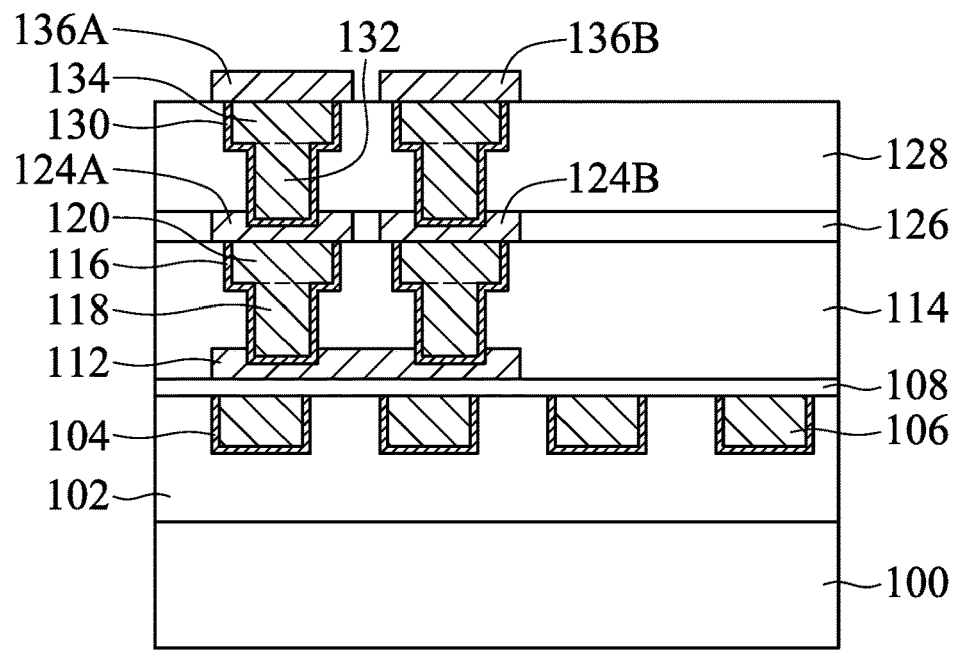
FIG. 5 is a cross-sectional view of a semiconductor device structure, in accordance with some embodiments.

Many variations and/or modifications can be made to embodiments of the disclosure. FIG. 5 is a cross-sectional view of a semiconductor device structure, in accordance with some embodiments. In some embodiments, FIG. 5 shows a structure similar to that shown in FIG. 1I. In some embodiments, the resistive element 112 is slightly recessed due to the etching process used for forming the via holes. As a result, the conductive vias 118 formed in the via holes may slightly extend into the resistive element 112.

Figure 6:
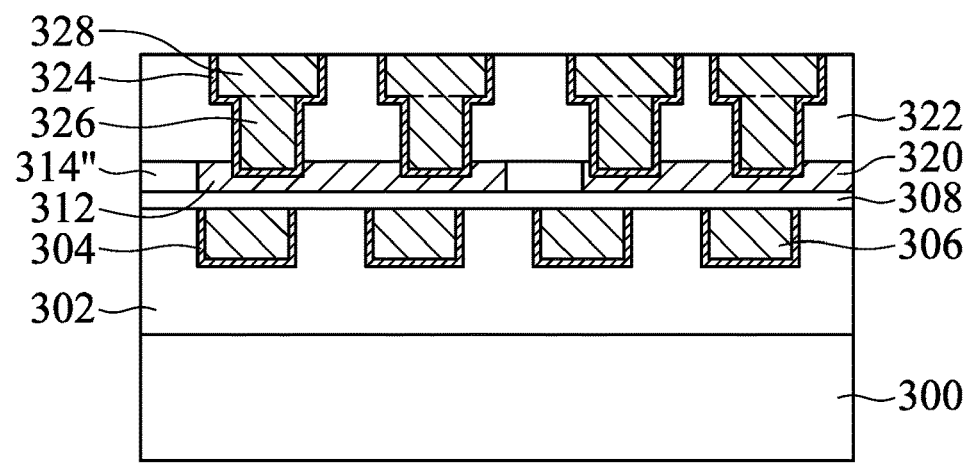
FIG. 6 is a cross-sectional view of a semiconductor device structure, in accordance with some embodiments.

FIG. 6 is a cross-sectional view of a semiconductor device structure, in accordance with some embodiments. In some embodiments, FIG. 6 shows a structure similar to that shown in FIG. 3H. In some embodiments, the resistive elements 312 and 320 are slightly recessed due to the etching process used for forming the via holes. As a result, the conductive vias 326 formed in the via holes may slightly extend into the resistive element 312 and/or the resistive element 320.

Figure 7:
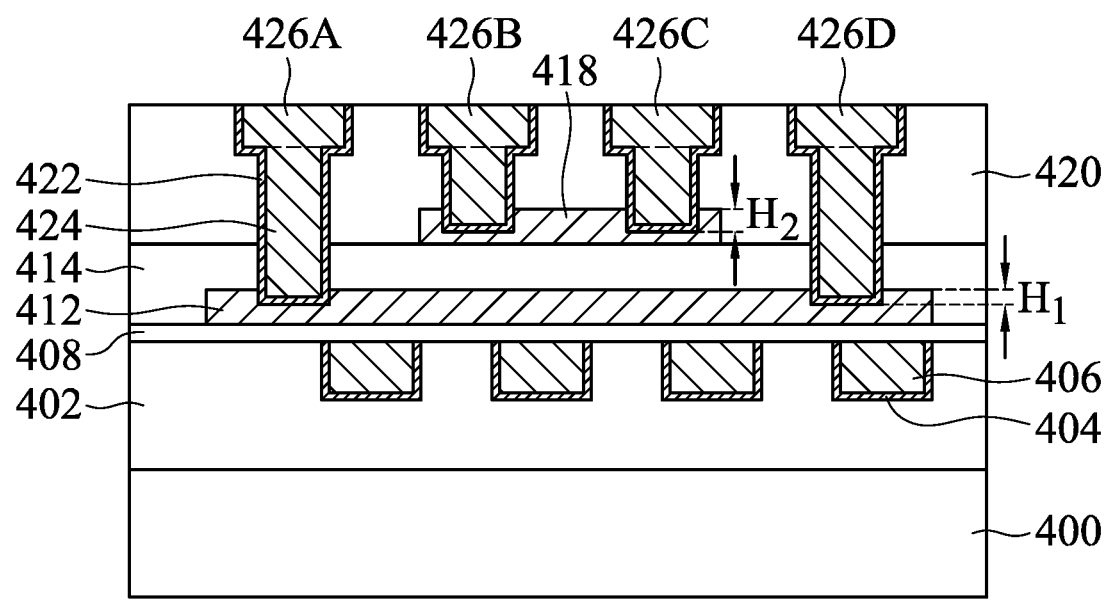
FIG. 7 is a cross-sectional view of a semiconductor device structure, in accordance with some embodiments.

FIG. 7 is a cross-sectional view of a semiconductor device structure, in accordance with some embodiments. In some embodiments, FIG. 7 shows a structure similar to that shown in FIG. 4F. In some embodiments, the resistive elements 412 and 418 are slightly recessed due to the etching process used for forming the via holes. As a result, the conductive vias 326 formed in the via holes may slightly extend into the resistive element 412 and/or the resistive element 418. The portion of one of the conductive vias 424 extending into the resistive element 412 may have a height $H_1$. The portion of one of the conductive vias 424 extending into the resistive element 418 may have a height $H_2$. In some embodiments, the height $H_2$ is greater than the height $H_1$. However, many variations and/or modifications can be made to embodiments of the disclosure. In some other embodiments, the height $H_1$ is substantially equal to the height $H_2$. In some other embodiments, the height $H_1$ is greater than the height $H_2$.

Embodiments of the disclosure form a semiconductor device structure with multiple resistive elements. The multiple resistive elements may be stacked and linked together to provide desired resistance without enlarging occupied area. The multiple resistive elements may be laterally arranged depending on the requirement. Stacked resistive elements may also be used as parts of a capacitor to provide multiple functions. Accordingly, the semiconductor device structure with the multiple resistive elements may have better performance and reliability.

In accordance with some embodiments, a semiconductor device structure is provided. The semiconductor device structure includes a semiconductor substrate and a first resistive element and a second resistive element over the semiconductor substrate. The semiconductor device structure also includes a first conductive feature electrically connected to the first resistive element and a second conductive feature electrically connected to the second resistive element. The semiconductor device structure further includes a dielectric layer surrounding the first conductive feature and the second conductive feature.

In accordance with some embodiments, a semiconductor device structure is provided. The semiconductor device structure includes a semiconductor substrate and a first resistive element over the semiconductor substrate. The semiconductor device structure also includes a second resistive element over the first resistive element, and the first resistive element is larger than the second resistive element. The semiconductor device structure further includes a dielectric layer between the first resistive element and the second resistive element.

In accordance with some embodiments, a semiconductor device structure is provided. The semiconductor device structure includes a semiconductor substrate and a first resistive element and a second resistive element over the semiconductor substrate. A top surface of the second resistive element is as high as or higher than a top surface of the first resistive element. The semiconductor device structure also includes a dielectric layer between the first resistive element and the second resistive element.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device structure, comprising:
    a semiconductor substrate;
    a first resistive element and a second resistive element over the semiconductor substrate;
    a first conductive feature and a second conductive feature electrically connected to the first resistive element, wherein the second resistive element is between the first conductive feature and the second conductive feature, and the second resistive element is electrically isolated from the first conductive feature and the second conductive feature, wherein a first portion of the first conductive feature is entirely above a topmost surface of the first resistive element, and the first portion of the first conductive feature is below a bottom surface of the second resistive element;
    a third conductive feature electrically connected to the second resistive element; and
    a dielectric layer surrounding the first conductive feature and the second conductive feature.

2. The semiconductor device structure as claimed in claim 1, wherein the first resistive element is between the second resistive element and the semiconductor substrate.

3. The semiconductor device structure as claimed in claim 2, wherein the first resistive element is larger than the second resistive element.

4. The semiconductor device structure as claimed in claim 2, further comprising a capacitor dielectric layer between the first resistive element and the second resistive element, wherein the capacitor dielectric layer has a greater dielectric constant than that of the dielectric layer.

5. The semiconductor device structure as claimed in claim 4, wherein the first conductive feature has a first portion extending into the first resistive element, the third conductive feature has a second portion extending into the second resistive element, and the second portion is longer than the first portion.

6. The semiconductor device structure as claimed in claim 1, further comprising a barrier layer between the dielectric layer and the first conductive feature, wherein the first resistive element has a greater atomic concentration of nitrogen than that of the barrier layer.

7. The semiconductor device structure as claimed in claim 1, wherein the first conductive feature extends upwardly above a top surface of the second resistive element.

8. The semiconductor device structure as claimed in claim 1, wherein the second resistive element is thinner than the first resistive element.

9. The semiconductor device structure as claimed in claim 1, wherein the second resistive element has a greater resistance than that of the first resistive element.

10. The semiconductor device structure as claimed in claim 1, further comprising a capacitor dielectric layer between the first resistive element and the second resistive element, wherein the capacitor dielectric layer is in direct contact with the dielectric layer.

11. The semiconductor device structure as claimed in claim 1, wherein the topmost surface of the first resistive element is lower than a bottommost surface of the second resistive element.

12. The semiconductor device structure as claimed in claim 1, further comprising a capacitor dielectric layer between the first resistive element and the second resistive element, wherein the second resistive element is entirely above a top surface of the capacitor dielectric layer.

13. The semiconductor device structure as claimed in claim 12, wherein a bottom surface of the capacitor dielectric layer is level with a bottommost surface of the first resistive element.

14. A semiconductor device structure, comprising:
a semiconductor substrate;
a first resistive element over the semiconductor substrate;
a second resistive element over the first resistive element, wherein the first resistive element is larger than the second resistive element;
a dielectric layer between the first resistive element and the second resistive element;
a conductive feature, wherein a bottom portion of the conductive feature is entirely above a topmost surface of the first resistive element, the bottom portion of the conductive feature is below the second resistive element, and a top portion of the conductive feature is above the first resistive element and the second resistive element; and
a barrier layer between the conductive feature and the dielectric layer, wherein the barrier layer surrounds the conductive feature and contacts sidewalls of the conductive feature.

15. The semiconductor device structure as claimed in claim 14, wherein the first resistive element has a greater atomic concentration of nitrogen than that of the barrier layer.

16. The semiconductor device structure as claimed in claim 15, wherein the barrier layer is in direct contact with the first resistive element.

17. The semiconductor device structure as claimed in claim 14, further comprising a second dielectric layer covering the first resistive element and the second resistive element, wherein the dielectric layer has a greater dielectric constant than that of the second dielectric layer.

18. The semiconductor device structure as claimed in claim 17, wherein the bottom portion of the conductive feature is in the dielectric layer, and the top portion of the conductive feature is in the second dielectric layer.

19. A semiconductor device structure, comprising:
a semiconductor substrate;
a first resistive element and a second resistive element over the semiconductor substrate, wherein a top surface of the second resistive element is higher than a top surface of the first resistive element;
a dielectric layer between the first resistive element and the second resistive element;
a conductive feature, wherein a bottom portion of the conductive feature is entirely above a topmost surface of the first resistive element, the bottom portion of the conductive feature is below the second resistive element and between the first resistive element and the second resistive element, and a top portion of the conductive feature is above the top surface of the second resistive element; and
a barrier layer between the conductive feature and the dielectric layer, wherein the first resistive element is denser than the barrier layer.

20. The semiconductor device structure as claimed in claim 19, wherein the first resistive element and the second resistive element are electrically isolated from each other.

* * * * *